United States Patent [19]

Purdes

[11] 4,450,042
[45] May 22, 1984

[54] PLASMA ETCH CHEMISTRY FOR ANISOTROPIC ETCHING OF SILICON

[75] Inventor: Andrew J. Purdes, Garland, Tex.

[73] Assignee: Texas Instruments Incorporated, Dallas, Tex.

[21] Appl. No.: 395,205

[22] Filed: Jul. 6, 1982

[51] Int. Cl.³ .................. H01L 21/306; B44C 1/22; C03C 15/00; C03C 25/06

[52] U.S. Cl. .................. 156/643; 156/646; 156/657; 156/659.1; 156/662; 204/192 E; 252/79.1

[58] Field of Search ............ 156/643, 646, 657, 659.1, 156/662, 653, 345; 252/79.1; 204/164, 192 E, 298; 427/38, 39

[56] References Cited

U.S. PATENT DOCUMENTS 4,211,601  7/1980  Mogab ........................ 156/646 X
4,308,089 12/1981  Iida et al. ...................... 156/643
4,352,724 10/1982  Sugishima et al. ............. 156/643 X Primary Examiner—William A. Powell
Attorney, Agent, or Firm—Melvin Sharp; James T. Comfort

[57] ABSTRACT

A plasma etch chemistry which allows a near perfectly vertical etch of silicon is disclosed. A Cl-containing compound such as $BCl_3$ has $Br_2$ added to it, readily allowing anisotropic etching of silicon. This is due to the low volatility of $SiBr_4$. The silicon surface facing the discharge is subjected to ion bombardment, allowing the volatilization (etching) of silicon as a Si-Cl-Br compound. The Br which adsorbs on the sidewalls of the etched silicon protects them from the etching. This new plasma etch chemistry yields a very smooth etched surface, and the etch rate is relatively insensitive to the electrical conductivity of the silicon.

17 Claims, 3 Drawing Figures

PLASMA ETCH CHEMISTRY FOR ANISOTROPIC ETCHING OF SILICON

BACKGROUND OF THE INVENTION

Current plasma etch processes now commonly used to etch materials for semiconductor device fabrication consist of an electrical discharge of halogen bearing gases. Halogen typically encountered in these processes are fluorine, chlorine, and bromine. The process begins with application of a masking material, such as photoresist, to protect the desired geometries of the device from the etch process. The device in process is then placed in a plasma reactor and etched. The subsequent steps are determined by the type device being fabricated. This process is especially valuable for the definition of small geometries on the order of one to five microns. For definition of geometries of less than one micron, it is essential that the etching proceed only in the vertical direction. The fragile nature of the small geometry structures cannot have a reasonable degree of reliability if any significant amount of undercutting takes place during the process.

A very common silicon etch process is based on fluorine. When mixtures such as $CF_4$-$O_2$ are dissociated in an electrical discharge, fluorine atoms are liberated, and volatilize the silicon as $SiF_4$. Such processes are isotropic; they etch in all directions at the same rate. Anisotropic, or vertical, etches in silicon are not observed when fluorine is the sole etchant.

In U.S. Pat. No. 4,226,665, Mogab describes etch chemistries which yield vertical etches. For vertical etching of silicon a chemistry such as $C_2F_6$-$Cl_2$ is indicated. The $C_2F_6$ serves as a source of "recombinants", such as $CF_3$. The recombinants suppress etching in the horizontal direction by recombining with Cl atoms, which have been adsorbed on the etched walls. Etching can proceed in the vertical direction because ion bombardment from the plasma suppresses the recombination mechanism.

Chemistries based on chlorine are now considered to be necessary for vertical etching of silicon, and discharges of pure $Cl_2$ have been found useful for this purpose. However, some silicon materials, such as highly doped polysilicon, may still experience some undercutting if etch conditions are not closely controlled. Thus it is an object of the present invention to provide a fast anisotropic etch which is applicable to any material containing a large fraction of silicon.

SUMMARY OF THE INVENTION

In one aspect of the present invention, there is provided a plasma etch chemistry, which has been shown to be capable of nearly perfectly vertical etching of silicon or materials having significant content of silicon. In a preferred embodiment, a Cl-containing compound such as $BCl_3$ has $Br_2$ added to it, and anisotropic etching is very well done using this mixture. This is accomplished by the formation of a Si-Br compound on the sidewalls of the etch cavity, while the ion bombardment on the flat surface inhibits the formation of the compound in that area. The silicon is etched as Si-Cl-Br compound.

The etch process consists of selectively etching a layer of silicon or material containing silicon. The material is first masked then placed in a plasma reactor, where the plasma chemistry consists of a bromine added to chlorine or fluorine gaseous compound. Alternatively, the plasma may consist of bromine, added to a compound containing both chlorine and fluorine, e.g., $CCl_2F_2$.

DETAILED DESCRIPTION OF THE INVENTION

The present invention teaches that a highly anisotropic etch is achieved by the addition of $Br_2$ to the silicon etching chemistry. Ion bombardment overcomes the resistance to etching on flat surfaces, but lateral etching is suppressed by the formation of a Si-Br compound on the sidewalls which do not experience ion bombardment.

Experiments were performed including various gases such as $SiCl_4$-$Cl_2$, $SiCl_4$-$Br_2$, $BCl_3$-$Cl_2$ and $BCl_3$-$Br_2$. A single-slice plasma etch machine was used for these experiments, and all tests done at 300 microns pressure, and RF power of 200 watts at a frequency of 13.56 Mhz. Both the RF peak-to-peak and DC electrode voltages were measured. The $SiCl_4$ and $BCl_3$ flow rates were 187 sccm and the $Cl_2$ and $Br_2$ flow rates were 13 sccm. The etch rates of silicon single crystal wafers with photoresist masks were determined from the steps etched in the silicon. The results of these tests are shown in table I.

TABLE I

| Chemistry | Si Rate (A/min) | RF/DC (volts) |
|---|---|---|
| SiCl—Cl$_2$ | 520 | 450/87 |
| SiCl$_4$—Br$_2$ | 640 | 460/89 |
| BCl$_3$—Cl$_2$ | 640 | 700/191 |
| BCl$_3$—Br$_2$ | 340 | 683/188 |

As shown in Table I, the $BCl_3$-$Br_2$ chemistry yields a much lower etch rate than the other chemistries. This chemistry, therefore, seemed to be more capable of achieving a vertical etch. Next, tests were performed for identification of the species that actually etch the silicon. The pressure, power, and frequency were identical to the first tests. The $Br_2$ flow rate was set at 13 sccm for all tests. The results of these tests are given in Table II.

TABLE II

| Run # | He Flow (sccm) | BCl$_3$ Flow (sccm) | Si Rate (A/min) | RF/DC (Volts) |
|---|---|---|---|---|
| 1 | 0 | 187 | 560 | 695/184 |
| 2 | 93 | 93 | 560 | 814/246 |
| 3 | 187 | 0 | 0 | 1475/570 |
| 4 | 138 | 13 | 1400 | 1378/500 |

Table II indicates that dilution with helium greatly increases the electrode voltage, i.e., the energy of ion bombardment of the etch surface is increased. The highest etch rate was achieved for the chemistry He-$BCl_3$-$Br_2$, with the $BCl_3$ and $Br_2$ flow rates both at 13 sccm (run #4). Comparing runs #2 and #4, the increased voltages are likely responsible for the much higher etch rate. Also, the chemistry He-Br$_2$ does not etch the silicon at all.

Further experiments were concentrated on the He-BCl$_3$-Br$_2$ chemistry, with relatively small BCl$_3$ and Br$_2$ flow rates compared to the helium flow rate. Again the pressure, power, and frequency are identical to that of the other tests. Table III shows various combinations of flow rates, and the accompanying results.

TABLE III

| Run # | He (sccm) | BCl$_3$ (sccm) | Br$_2$ (sccm) | Si Rate (Å/min) | RF/DC (volts) |
|---|---|---|---|---|---|
| 1 | 174 | 13 | 13 | 1400 | 1298/474 |
| 2 | 187 | 13 | 0 | 440 | 1610/599 |
| 3 | 160 | 13 | 27 | 1020 | 1118/402 |
| 4 | 193 | 7 | 0 | 380 | 1760/668 |

Figure 1:
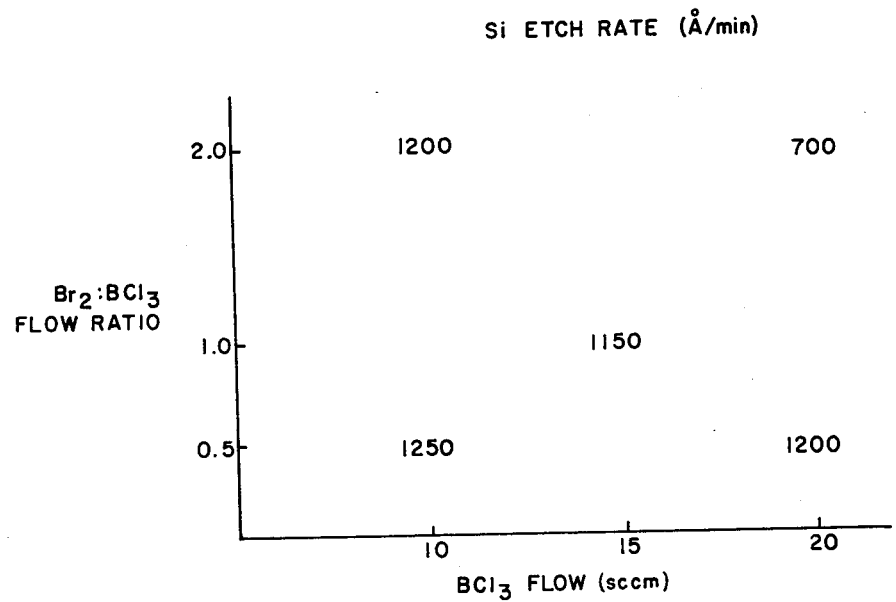
FIG. 1 is a graph showing the etch rate of Si as a function of the flow rate of $BCl_3$ and the flow rate ratio of $Br_2$ to $BCl_3$.
Figure 2:
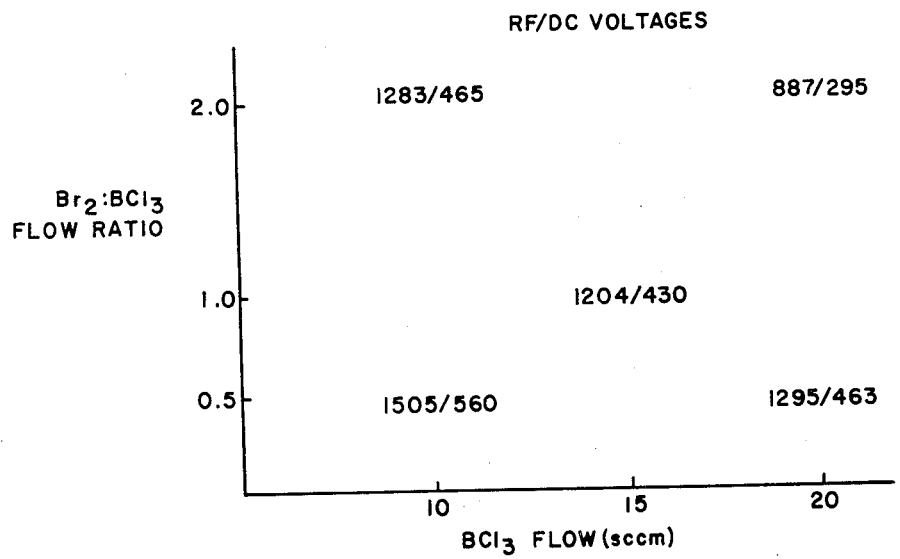
FIG. 2 is a graph showing the RF and DC voltages measured in a plasma reactor as a function of $BCl_3$ flowrate and $BCl_3$ to $Br_2$ flow rate ratio.

More testing investigated the effect of BCl$_3$ flow rate and Br$_2$:BCl$_3$ flow rate ratio on the silicon etch rate. The conditions are the same as in the preceding work, with a 200 sccm total gas flow (He+BCl$_3$+Br$_2$). In FIG. 1, various combinations of BCl$_3$ flow rate and Br$_2$:BCl$_3$ flow rate ratios show the resultant silicon etch rate in angstroms/minute. From the graph, the etch rate is somewhat constant around 1200 Å/min. except for high Br$_2$:BCl$_3$ ratios (2:1) and high BCl$_3$ flow rate (20 sccm). FIG. 2 shows the RF/DC voltages measured for the same BCl$_3$ flow rate and Br$_2$:BrCl$_3$ ratio combinations as in FIG. 1. As indicated, the silicon etch rate varies directly as the RF/DC voltages. Note that the lowest voltages track closely the lowest etch rate.

Figure 3:
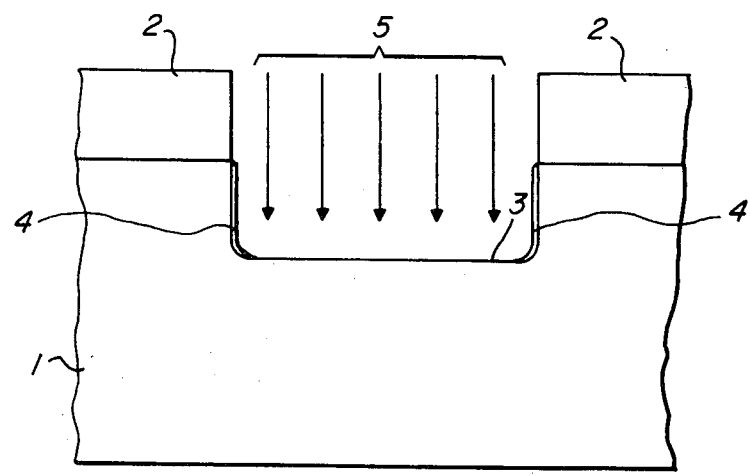
FIG. 3 is a cross-section drawing showing the operation by the etch process of the present invention.

FIG. 3 is a cross-sectional view of the etch process of the present invention. The silicon material 1 is covered by an insulator 2 except in those areas where the surface 3 is to be etched. The ion bombardment 5 of the plasma discharge enhances the volatilization of compounds which are formed on the etch surface 3, but on the sidewalls of the etched cavity the non-volatile compound 4 forms and adsorbs on the sidewalls.

In other tests, the etch rates of different types of silicon were measured. Three types of silicon were involved; single crystal, lightly doped polysilicon (120 ohms/square), and highly doped polysilicon (25 ohms/square).

Both of the polysilicon films were 0.5 microns thick. The etch conditions were; pressure-300 microns; power (RF)-200 watts; He flow rate-170 sccm; BCl$_3$ flow rate-10 sccm; and Br$_2$ flow rate-20 sccm. The etch rates for these conditions on the different types of silicon are shown in table IV.

TABLE IV

| Si Type | Etch Rate (Å/min) |
|---|---|
| Single crystal | 950 |
| 120 ohm/sq poly | 1000 |
| 25 ohm/sq poly | 1200 |

As seen from the results in Table IV, the silicon etch rate is relatively insensitive to the type of silicon involved. As expected, the highest etch rate was seen on the most highly doped polysilicon.

The results of the tests conducted indicate that the addition of Br$_2$ to certain halogen-bearing gases contributes significantly to a nearly perfect vertical etch of silicon. In particular, the combination of BCl$_3$ and Br$_2$ and a diluent such as He yields highly desirable results in that the etched surface of the silicon is very smooth. Therefore, the apparent improvements to the plasma etch process, in the form of increased etch rates and nearly perfect vertical etch (no undercutting), afforded by the present invention, will be immediately recognized by those skilled in the art.

It should be noted that, while the use of bromine is crucial in achieving the advantage of the present invention, the use of BCl$_3$ is not critical at all. A wide variety of other chlorine-bearing etchants can be substituted for the BCl$_3$, including but not limited to SiCl$_4$, PCl$_3$, molecular chlorine, or hydrogen chloride. Moreover, a fluorine-bearing gas, or a fluorine and chlorine-bearing mixture can also alternatively be used. Thus, for example, use of bromine in combination with such etchant gas species as, tetrafluoromethane, hexafluoromethane, octofluoropentane, trifluoromethane, trifluorochoromethane, difluorodichloromethane, fluorotrichloromethane or a wide variety of others are in the scope of the present invention.

Similarly, other inert gases such as neon, argon, or nitrogen, can be substituted for helium.

Since the crucial advantage of the present invention derived in large part from the function of silicon tetrabromide as a sidewall passivating agent, the etch process taught by the present invention is applicable not only to crystalline silicon or polysilicon, but is also applicable to materials contents which contain a small or large fraction of silicon. Thus, the etch mixture taught by the present invention is not only applicable to anisotropic etching of silicon nitride, but also is applicable to anisotropic etching of a wide variety of metal silicides, including but not limited to titanium silicide, molybdenum silicide, tungsten silicide, tantalum silicide, platinum silicide, paladium silicide, nickel silicide, and cobalt silicide. Where the present invention is applied to etching silicides, the etchant gas is preferably a gas containing both chlorine and fluorine-bearing species, to accomplish transport of the metal away from the etch site. However, a mixture of bromine with an etchant gas containing only chlorine-bearing species, or only fluorine-bearing species, is alternatively possible.

Thus, for example, a first embodiment of the present invention, as applied to anisotropic etching of silicon nitride uses a pressure in the neighborhood of 300 microns, RF power in the neighborhood of 200 watts, a helium flow rate of 170 sccm, a borontrichloride flow rate in the neighborhood of 10 sccm, and a bromine flow rate in the neighborhood of 20 sccm. However, silicon nitride etching may be practiced with a broad range of substitutions in this preferred formula, including pressure in the range of 50 to 1000 microns, power density in the range of 1 to 30 watts per square inch, halogen-bearing gas flow in the range of 1 to 100 sccm, inert gas flow rate in the range of 0 to 30 times the flow rate of the halogen-bearing etchant, and bromine flow rate in the range of ⅓ to 3 times the flow rate of the halogen-bearing etchant. These same parameter ranges also apply to etching of silicon, polysilicon, or silicides.

That is, the present invention provides a basic innovation in principle for plasma etching silicon-bearing materials. Bromine is used in combination with a fluorine or chlorine-bearing etchant, so that the sidewalls of the material are passivated by silicon tetrabromide, leading to highly anisotropic etching.

Thus, the present invention provides the advantage of an anisotropic etch for silicon.

The present invention provides the further advantage of an anisotropic etch for silicon or polysilicon, which is insensitive to doping level.

The present invention provides the further advantage of a highly anisotropic etch for silicon-bearing materials, which is highly insensitive to doping level.

The present invention provides the further advantage of a highly anisotropic etch for silicon, which leaves a smooth clean etched surface.

While the invention has been described in detail with respect to illustrative embodiments, it will be apparent to those skilled in the art that various changes can be made without departing from the spirit or scope of the invention.

What is claimed is:

1. The method for selectively etching a layer of a silicon-bearing material in an integrated circuit, comprising the steps of:
providing a patterned masking material over said silicon-bearing material to expose only the areas of said silicon-bearing material which are to be etched;
passing a gaseous mixture over said layer; and
creating a plasma discharge in said gaseous mixture adjacent to said layer of silicon-bearing material;
wherein said gaseous mixture comprises bromine and a chlorine-bearing species.

2. The method for selectively etching a layer of a silicon-bearing material in an integrated circuit, comprising the steps of:
providing a patterned masking material over said silicon-bearing material to expose only the areas of said silicon-bearing material which are to be etched;
passing a gaseous mixture over said layer; and
creating a plasma discharge in said gaseous mixture adjacent to said layer of silicon-bearing material;
wherein said gaseous mixture comprises bromine, a fluorine-bearing species, and a chlorine-bearing species.

3. The method of claim 1, wherein said chlorine-bearing species is selected from the group consisting of: silicon tetrachloride, carbon tetrachloride, phosophorus trichloride, chlorine, and hydrogen chloride.

4. The method of claim 2, wherein said fluorine-bearing species is selected from the group consisting of tetrafluoromethane, hexafluoroethane, and octofluoropropane.

5. The method of claim 2, wherein said gaseous mixture comprises a gas selected from the group consisting of: trifluoromethane, trifluorochloromethane, difluorodichloromethane, and fluorotrichloromethane.

6. The method of claim 1, 2, or 3, wherein said silicon-bearing material comprises single-crystal silicon.

7. The method of claim 1, 2, or 3, wherein said silicon-bearing material comprises polycrystalline silicon.

8. The method of claim 7, wherein said polycrystalline silicon comprises both lightly doped and heavily doped portions.

9. The method of claim 1, 2, or 3, wherein said silicon-bearing material comprises silicon nitride.

10. The method of claim 1, 2, or 3, wherein said silicon-bearing material comprises a metal silicide.

11. The method of claim 10, wherein said silicide is selected from the group consisting of: titanium silicide, molybdenum silicide, tungsten silicide, tantalum silicide, palladium silicide, and nickel silicide.

12. The method of claim 1, 2, or 3, wherein gaseous mixture further comprises a concentration of an inert gas.

13. The method of claim 12 wherein the concentration of said inert gas is at least 3 times the concentration of said bromine.

14. The method of claim 1, 2, or 3, wherein said gaseous mixture has a pressure in the range of 50 to 1000 microns.

15. The process of claim 1, 2, or 3, wherein power is applied to said plasma at a power density in the range of 3 to 30 watts per square inch.

16. The process of claim 1, 2, or 3, wherein said gaseous mixture includes bromine, said bromine being supplied at a flow rate in the range of 5 to 50 standard cc per minute.

17. The process of claim 16, wherein the total pressure is in the neighborhood of 300 microns.

* * * * *